(12) United States Patent
Wu et al.

(10) Patent No.: US 9,331,740 B2
(45) Date of Patent: May 3, 2016

(54) DEVICE SUPPRESSING COMMON-MODE RADIATION

(75) Inventors: Tzong-Lin Wu, Taipei (TW);
Chung-Hao Tsai, Taipei (TW);
Hui-Ling Ting, Taipei (TW)

(73) Assignee: NATIONAL TAIWAN UNIVERSITY, Taipei (TW)

( * ) Notice: Subject to any disclaimer, the term of this patent is extended or adjusted under 35 U.S.C. 154(b) by 263 days.

(21) Appl. No.: 13/605,102

(22) Filed: Sep. 6, 2012

(65) Prior Publication Data

US 2014/0014405 A1   Jan. 16, 2014

(30) Foreign Application Priority Data

Jul. 12, 2012   (TW) ............................. 101125051 A (51) Int. Cl.
*H04B 3/28* (2006.01)
*H05K 1/02* (2006.01)

(52) U.S. Cl.
CPC ............... *H04B 3/28* (2013.01); *H05K 1/0236* (2013.01)

(58) Field of Classification Search
CPC ................... H04B 3/28; H05K 1/0236

USPC ..................................................... 333/12, 181
See application file for complete search history.

(56) References Cited

U.S. PATENT DOCUMENTS

| 2010/0265159 A1* | 10/2010 | Ando et al. .................... 343/913 |
| 2011/0012697 A1* | 1/2011 | Takemura et al. ............ 333/212 |
| 2012/0032749 A1* | 2/2012 | Shiue et al. ....................... 333/5 |

\* cited by examiner

*Primary Examiner* — Robert Pascal
*Assistant Examiner* — Kimberly Glenn
(74) *Attorney, Agent, or Firm* — Bacon & Thomas, PLLC (57) ABSTRACT

The present invention provides a device for suppressing common-mode radiation comprising: at least one resonator embedded into a plate, wherein the at least one resonator defines a plane having a normal direction parallel and perpendicular, respectively, to a longitudinal direction and a thickness direction of the plate. The embedment of the resonator into the plate enables a magnetic field, which is generated by a cable conductor when the device for suppressing common-mode radiation wraps the cable conductor therein, to perpendicularly pass through the plane so that the magnetic field and the resonator resonate together to generate a strong diamagnetism and thereby to suppress the common-mode radiation.

22 Claims, 10 Drawing Sheets

DEVICE SUPPRESSING COMMON-MODE RADIATION

BACKGROUND OF THE INVENTION

1. Field of the Invention

The present invention relates to a device for suppressing common-mode radiation, and more particularly, to a device for suppressing common-mode radiation for a cable conductor.

2. Description of the Prior Art

With the rapid development of technologies, the operation speed and clock frequency of high-speed digital circuits have been increasing, and differential microstrip lines and strip lines are widely used to transmit data at high speed. Ideally, a differential transmission line is characterized by high noise tolerance, low electromagnetic radiation and low crosstalk effect. However, the differential mode circuit configuration may cause a noise voltage source or a noise current source on the circuit board. For example, a time-varying magnetic field generated by a common mode current loop of the differential mode circuit is coupled to other potential paths to generate an induced electromotive force (emf). The emf, the extended ground plane and the connected cable conductor altogether form an antenna, thereby causing common-mode radiation. For example, a capacitance between a differential mode transmission line, the extended ground plane and the connected cable conductor generates a displacement current and causes common-mode radiation.

Some methods have been proposed to suppress common-mode radiation caused by the connected cable conductor. In the most traditional method, a cable conductor is threaded through a ferrite bead, and when signals pass through the ferrite bead, the electromagnetic interference is reflected or absorbed and then converted to thermal energy for dissipation. However, the method is applicable only to the suppression of common-mode noise in the frequency band of a few hundred MHz and is seldom applied to suppress common-mode noise in the GHz frequency band in the cable conductor. Moreover, the ferrite bead is of great thickness and expensive.

As wireless communications are all operated in the GHz frequency band, conventional devices for suppressing common-mode noise in the cable conductor are not competent enough. Therefore, a need exists in the art for a device for suppressing common-mode radiation characterized in that it is thin, capable of effectively suppressing common-mode radiation and applicable in the GHz frequency band.

SUMMARY OF THE INVENTION

An object of the present invention is to provide a device for suppressing common-mode radiation characterized in that it is thin, capable of effectively suppressing common-mode radiation and applicable in the GHz frequency band.

To achieve the aforementioned object, the present invention provides a device for suppressing common-mode radiation comprising: at least one resonator embedded into a plate, wherein the at least one resonator defines a plane having a normal direction parallel and perpendicular, respectively, to a longitudinal direction and a thickness direction of the plate.

In the aforementioned device for suppressing common-mode radiation, the at least one resonator is a plurality of resonators embedded into the plate and arranged into arrays.

In the aforementioned device for suppressing common-mode radiation, the at least one resonator is a split-ring resonator (SRR).

In the aforementioned device for suppressing common-mode radiation, the SRR has a split in which a resistance is disposed.

In the aforementioned device for suppressing common-mode radiation, the at least one resonator is a spiral resonator.

In the aforementioned device for suppressing common-mode radiation, the at least one resonator comprises metal strips and via-posts.

The aforementioned device for suppressing common-mode radiation is configured to wrap a cable conductor therein. When the cable conductor is wrapped in the device for suppressing common-mode radiation, the magnetic field generated by the cable conductor perpendicularly passes through the plane.

In the aforementioned device for suppressing common-mode radiation, the plate is a flexible circuit board.

In the aforementioned device for suppressing common-mode radiation, the plate is made of a ferromagnetic material.

In the aforementioned device for suppressing common-mode radiation, the plate is made of a lossy material.

To achieve the aforementioned object, the present invention provides another device for suppressing common-mode radiation comprising: at least one resonator embedded into a plate, wherein the at least one resonator defines a plane through which a magnetic field generated by a cable conductor passes when the device for suppressing common-mode radiation wraps the cable conductor therein.

In the aforementioned device for suppressing common-mode radiation, a magnetic field generated by a cable conductor perpendicularly passes through the plane when the device for suppressing common-mode radiation wraps the cable conductor therein.

In the aforementioned device for suppressing common-mode radiation, the plane of the at least one resonator has a normal direction parallel and perpendicular, respectively, to a longitudinal direction and a thickness direction of the plate.

In the aforementioned device for suppressing common-mode radiation, the at least one resonator is a plurality of resonators embedded into the plate and arranged into arrays.

In the aforementioned device for suppressing common-mode radiation, the at least one resonator is a split-ring resonator (SRR).

In the aforementioned device for suppressing common-mode radiation, the SRR has a split in which a resistance is disposed.

In the aforementioned device for suppressing common-mode radiation, the at least one resonator is a spiral resonator.

In the aforementioned device for suppressing common-mode radiation, the at least one resonator comprises metal strips and via-posts.

In the aforementioned device for suppressing common-mode radiation, the plate is made of a ferromagnetic material.

In the aforementioned device for suppressing common-mode radiation, the plate is made of a lossy material.

In the present invention, the embedment of at least one resonator into a plate enables a magnetic field, which is generated by a cable conductor when the device for suppressing common-mode radiation wraps the cable conductor therein, to perpendicularly pass through the plane so that the magnetic field and the at least one resonator resonate together to generate a strong diamagnetism and thereby to suppress the common-mode radiation.

BRIEF DESCRIPTION OF THE DRAWINGS

FFIG. 1A is a pictorial view of a device for suppressing common-mode radiation in accordance with an embodiment of the present invention.

FFIG. 2 is a pictorial view of the device for suppressing common-mode radiation of FFIG. 1 in which a cable conductor is wrapped.

FFIG. 3 illustrates respective waveforms of the common-mode currents of a cable conductor wrapped and not wrapped in the device for suppressing common-mode radiation.

FFIG. 4 illustrates respective waveforms of the far-field radiation power of a cable conductor wrapped and not wrapped in the device for suppressing common-mode radiation.

FFIG. 5 is a schematic representation of the SRR of FFIG. 1 in which a resistance is disposed.

DETAILED DESCRIPTION OF THE PREFERRED EMBODIMENTS

The detailed embodiments of the present invention will be provided in the following paragraphs. It is to be noted that the embodiments of the present invention are exemplary. The present invention is not limited to the embodiments comprising specific features, structures or properties and the scope thereof is defined by the appended claims. In addition, the drawings do not specifically illustrate all unnecessary features of the present invention. For those illustrated in the drawings, they may be represented in simplified form or schematic manner. Furthermore, for the sake of clarity, the sizes of the components may be magnified in the drawings or not in actual proportion. Whether or not the components are simplified in form or the features are illustrated in detail, they fall within the scope of knowledge of the art so that they can be implemented by those skilled in the art in view of other embodiments related to the features, structures or properties.

Figure 1:
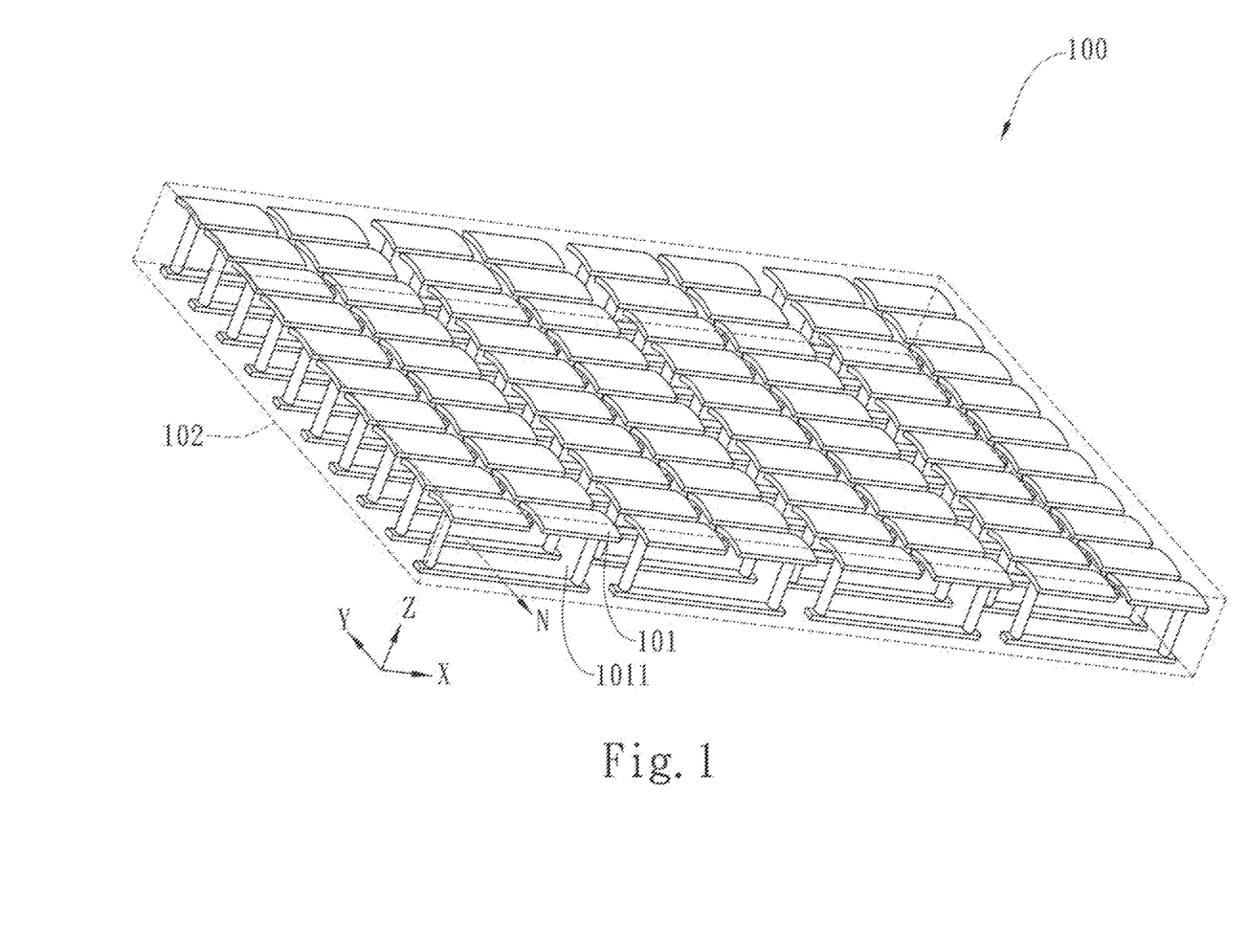

FFIG. 1A is a pictorial view of a device 100 for suppressing common-mode radiation in accordance with an embodiment of the present invention. The device 100 for suppressing common-mode radiation comprises a plurality of SRRs 101 and a flexible plate 102 into which the plurality of SRRs 101 are embedded and arranged into arrays. Each of the plurality of SRRs 101 has a loop-shaped structure with a split. The loop-shaped structure of the SRR 101 defines a plane 1011. When the SRR 101 is embedded into the flexible plate 102, a normal direction N of the plane 1011 defined by the SRR 101 is parallel and perpendicular, respectively, to a longitudinal direction Y and a thickness direction Z of the flexible plate 102.

Figure 2:
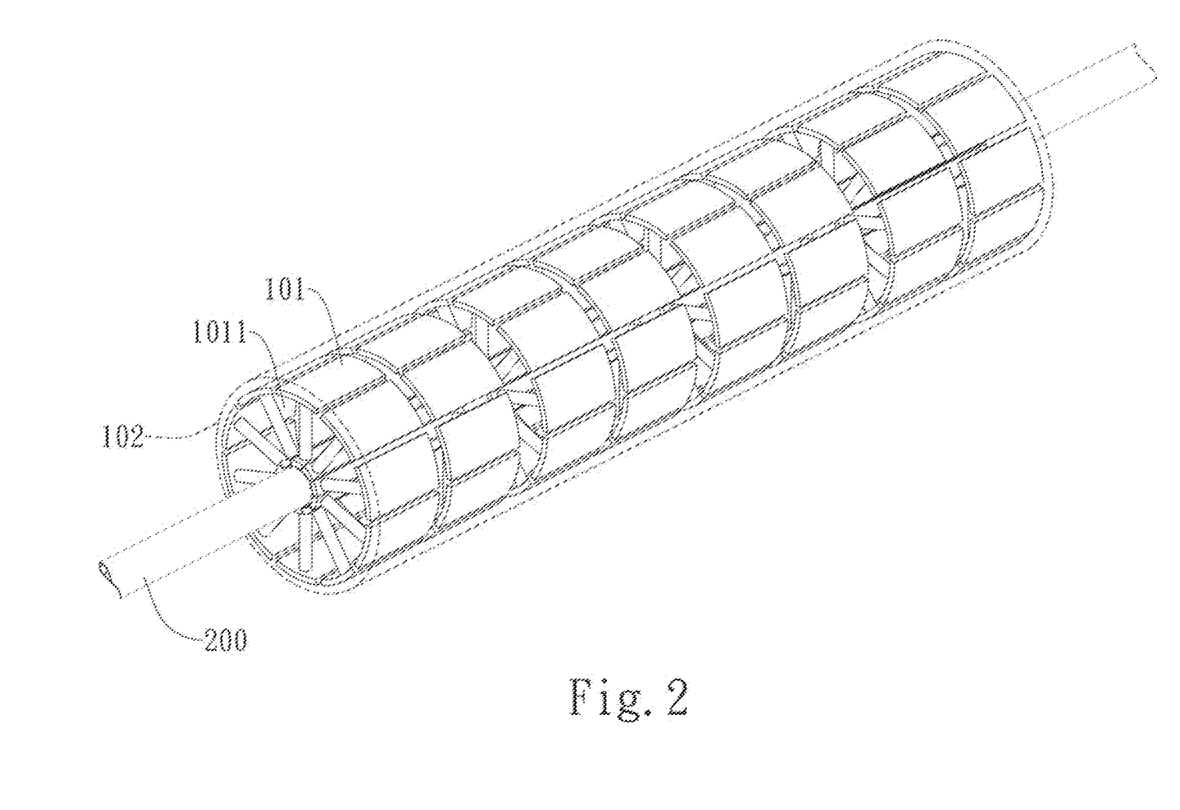
Figure 3:
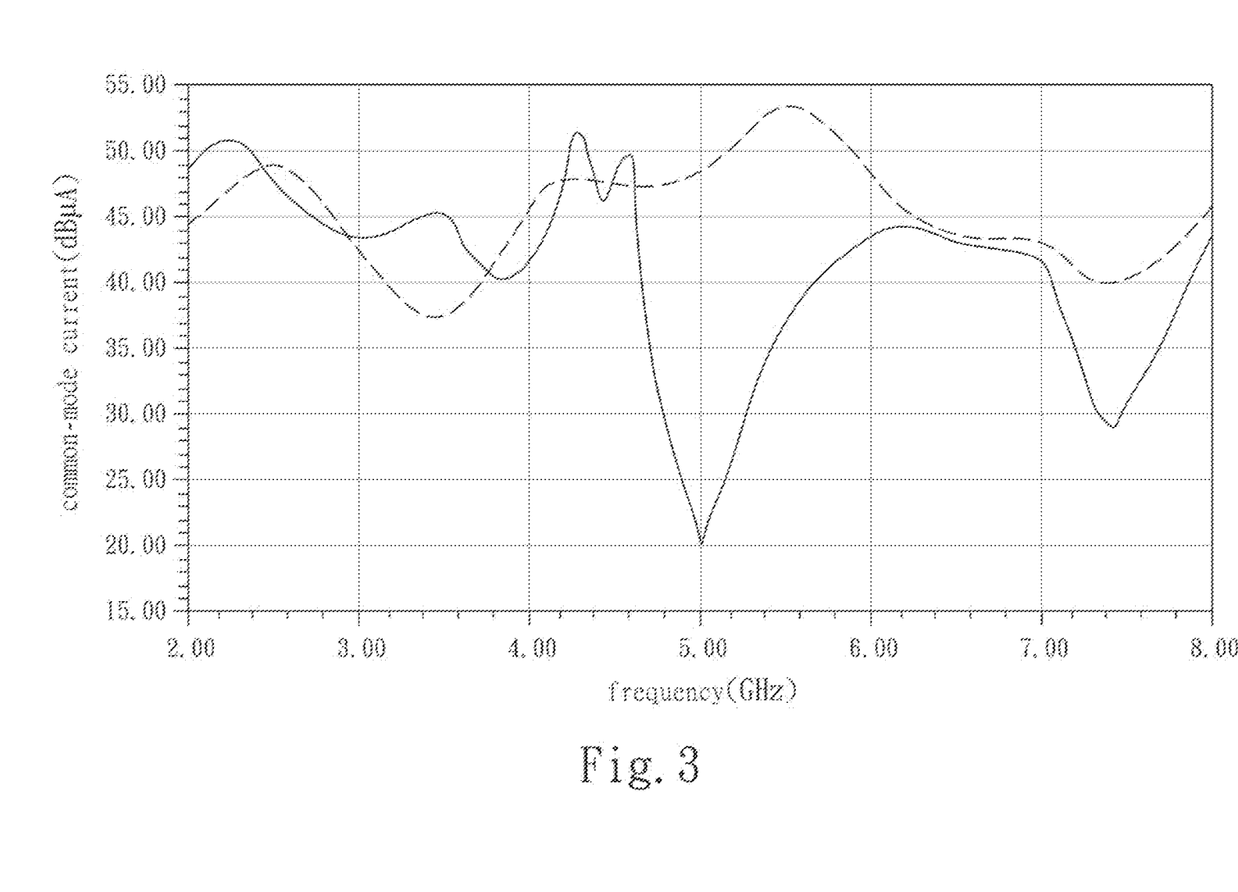
Figure 4:
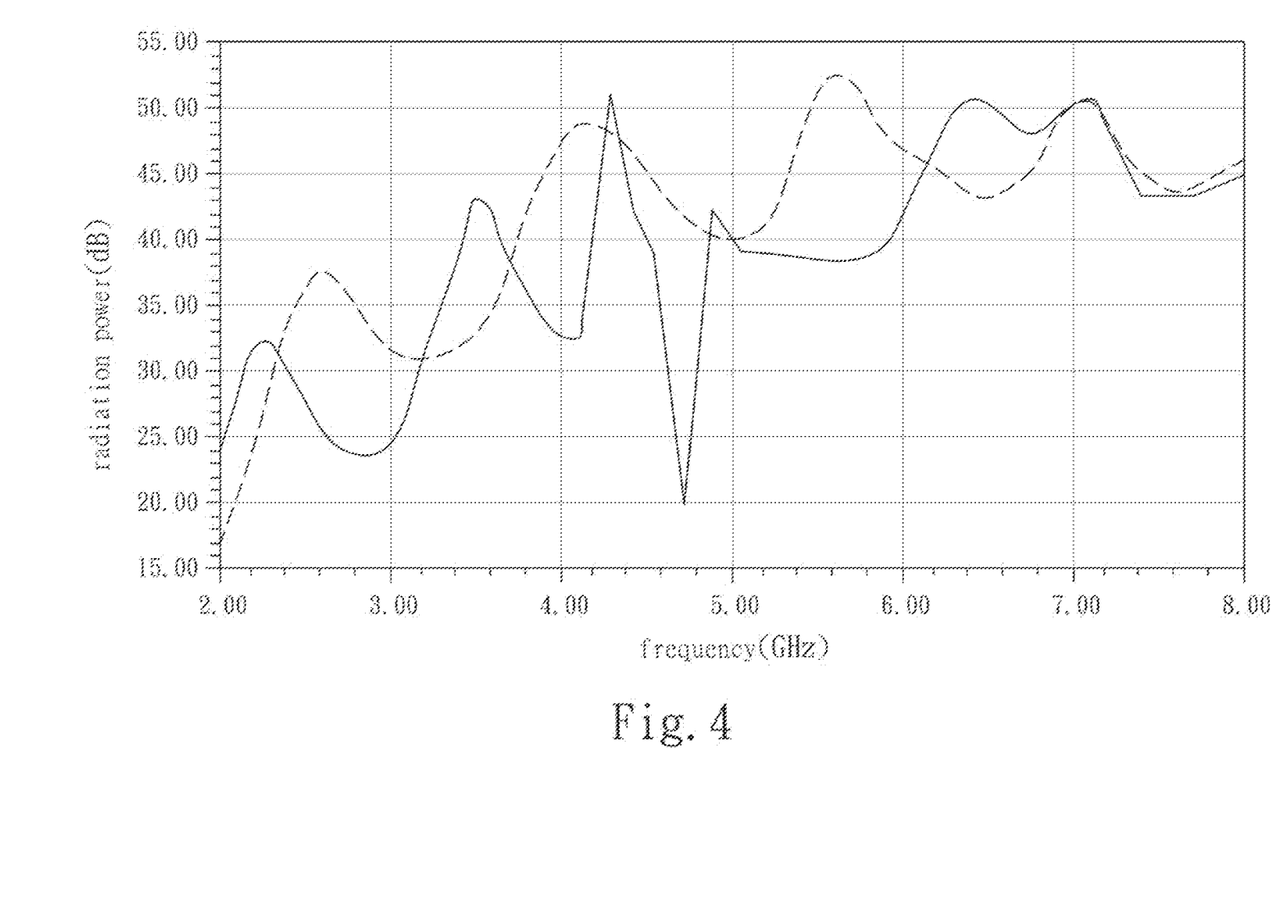

FFIG. 2 is a pictorial view of the device for suppressing common-mode radiation of FFIG. 1 in which a cable conductor is wrapped. The device 100 for suppressing common-mode radiation of the present invention is configured to wrap a cable conductor 200 therein. When the device 100 for suppressing common-mode radiation wraps the cable conductor 200 therein, a toroidal magnetic field generated by the cable conductor 200 perpendicularly passes through the planes 1011 of the plurality of SRRs 101. The variation in magnetic flux passing through the plurality of SRRs 101 causes a strong diamagnetism at a resonance frequency to prevent noise. Further, the plurality of SRRs arranged into arrays form a wideband stopband. FFIG. 3 illustrates respective waveforms of the common-mode currents of a cable conductor wrapped and not wrapped in the device for suppressing common-mode radiation of the present invention. FFIG. 4 illustrates respective waveforms of the far-field radiation power of a cable conductor wrapped and not wrapped in the device for suppressing common-mode radiation of the present invention. In FIGS. 3 and 4, the solid lines represent the waveforms with respect to a cable conductor wrapped in the device for suppressing common-mode radiation of the present invention, and the dashed lines represent the waveforms with respect to a cable conductor not wrapped in the device for suppressing common-mode radiation of the present invention. As can be seen in FIGS. 3 and 4, the magnitude of the common-mode current and the level of the far-field radiation power of the cable conductor wrapped in the device for suppressing common-mode radiation of the present invention are much less and lower than those of the cable conductor not wrapped in the device for suppressing common-mode radiation of the present invention in a frequency band of 4.6 GHz to 6.1 GHz. Therefore, the device for suppressing common-mode radiation of the present invention can effectively suppress the common-mode radiation caused by the cable conductor in the GHz frequency band. In another aspect, the parameters of the structure of the present invention, such as the design or the number of the resonator, etc., can be manipulated to control the frequency band, the bandwidth and the amount of suppression according to the needs.

Figure 5:
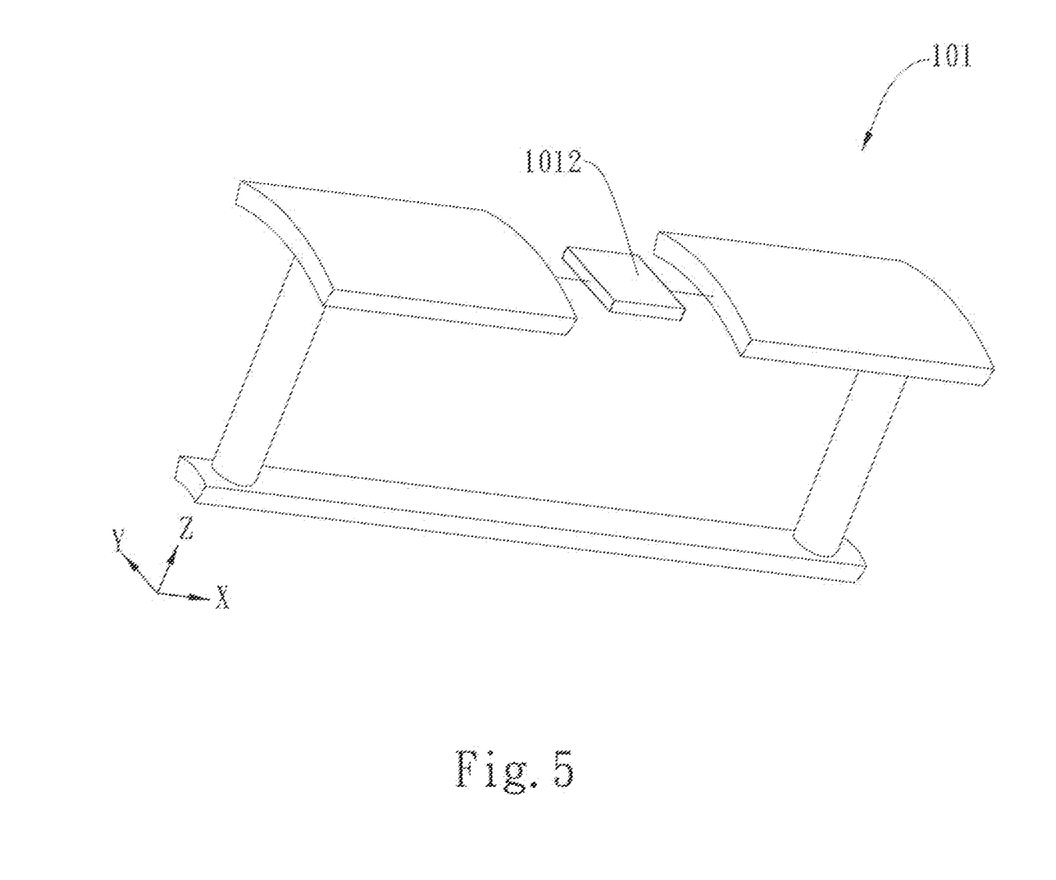
Figure 6A:
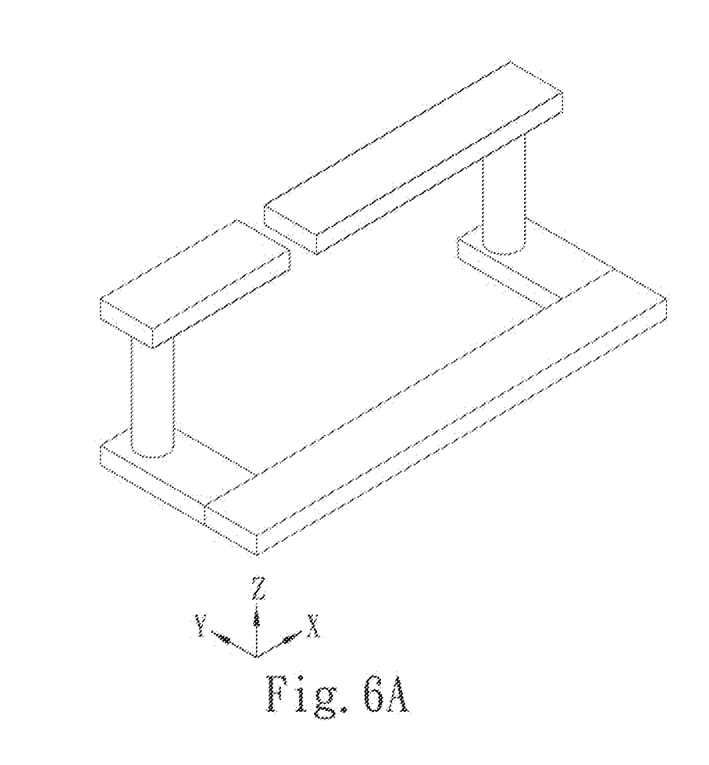
FIGS. 6A, 7A, 8A, 9A and 10A are pictorial views of the resonators in accordance with other embodiments of the present invention.
Figure 6B:
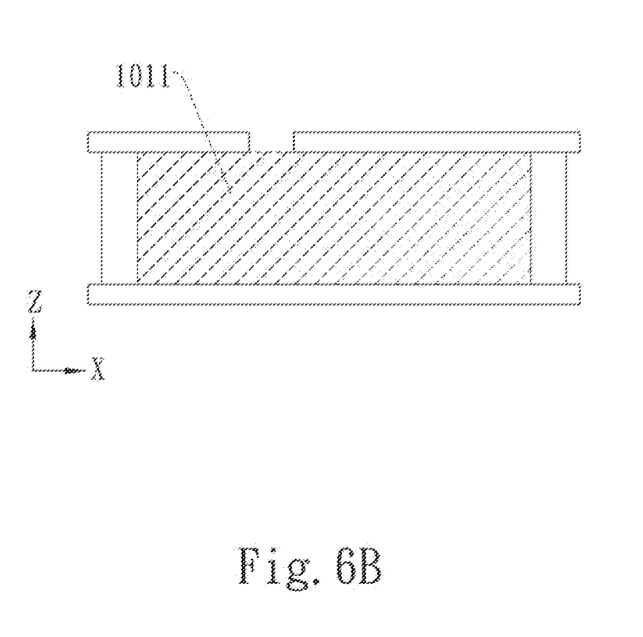
FIGS. 6B, 7B, 8B, 9B and 10B are front views of the resonators in FIGS. 6A, 7A, 8A, 9A and 10A.
Figure 7A:
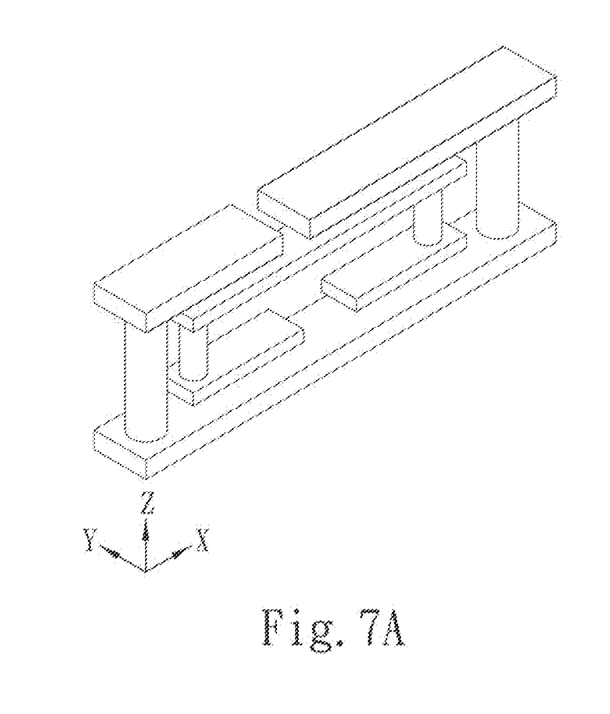
Figure 7B:
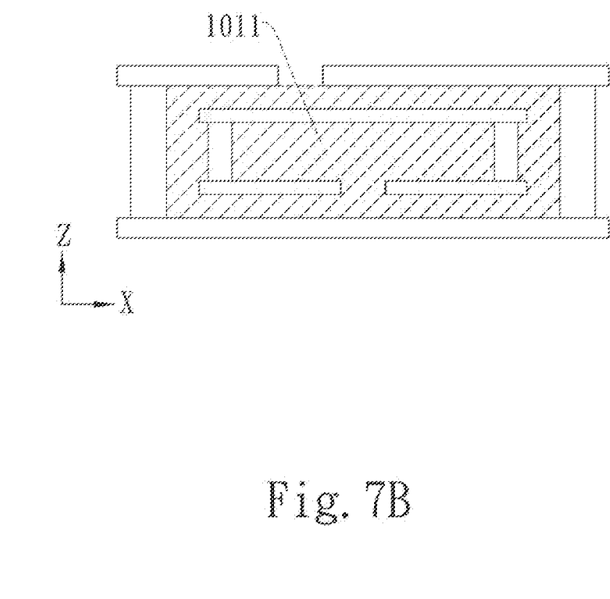
Figure 8A:
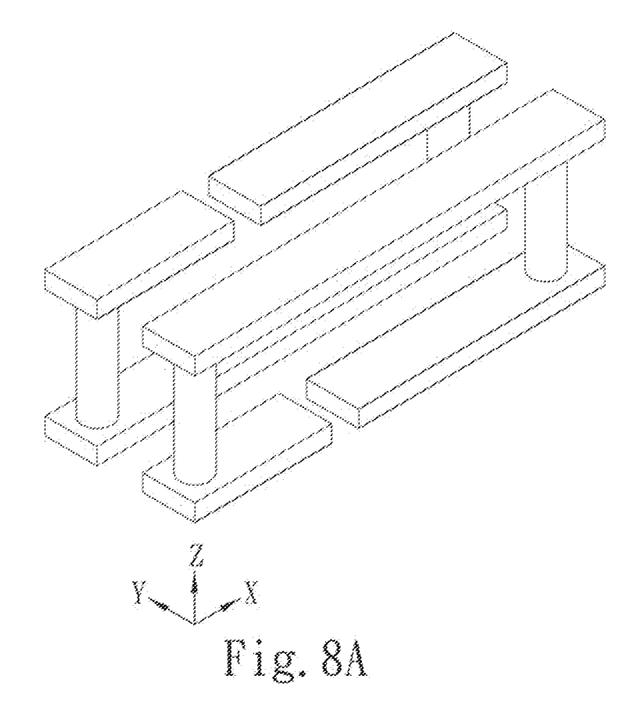
Figure 8B:
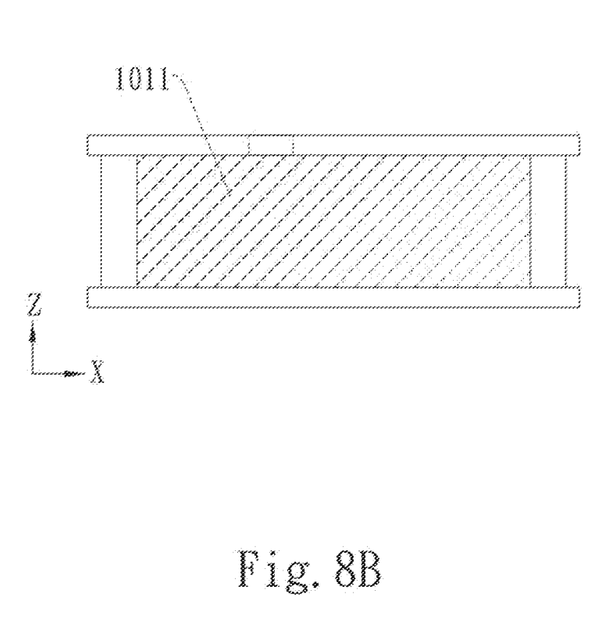
Figure 9A:
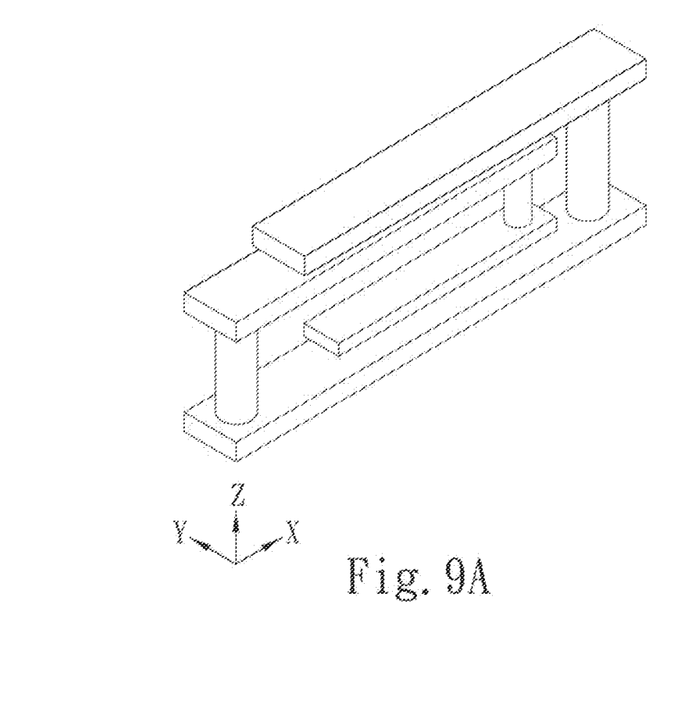
Figure 9B:
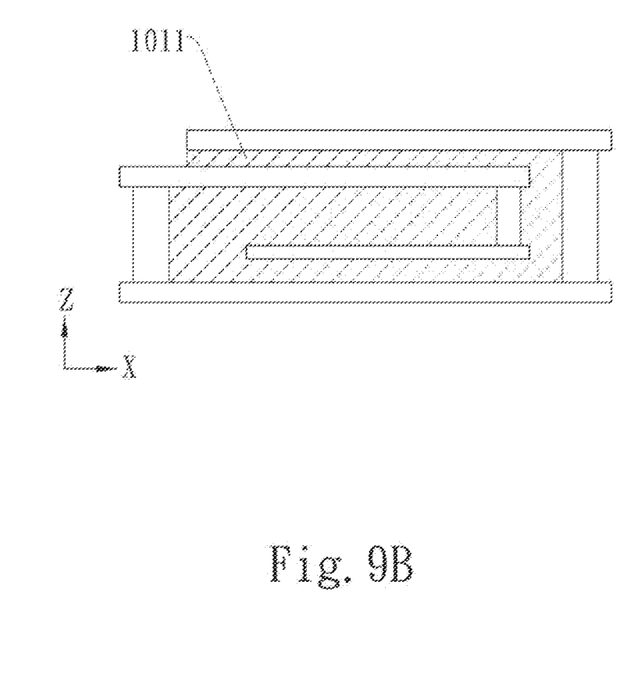
Figure 10A:
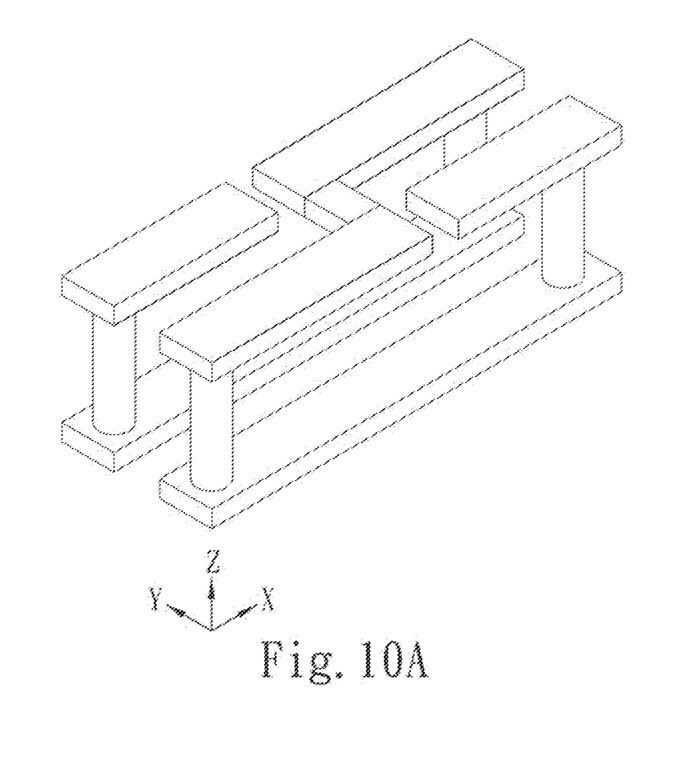
Figure 10B:
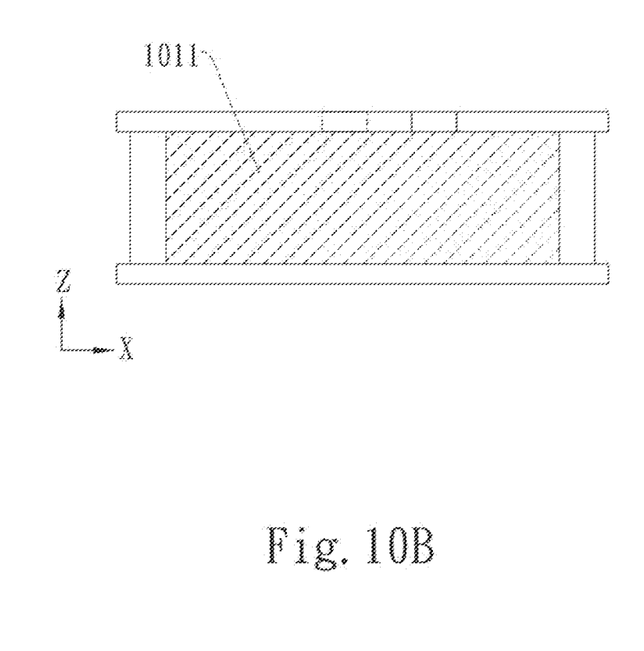

Referring to FFIG. 5, the SRR 101 in another embodiment of the present invention can further comprise a resistance 1012 disposed in the split thereof so as to increase the suppression capability of the device for suppressing common-mode radiation of the present invention. Moreover, while the device for suppressing common-mode radiation of the present invention adopts a flexible plate 101, it can adopt a plate made of a ferromagnetic material or a lossy material to increase its suppression capability.

Furthermore, the resonator used in the device for suppressing common-mode radiation of the present invention is not limited to the SRR, other resonators such as spiral resonators or resonators comprising metal strips and via-posts are applicable. While the resonator of the device for suppressing common-mode radiation of the present invention has a loop-shaped structure, it can be of any other structure (which will be detailed below) if convenience in the manufacturing process or other factors are taken into consideration. Such any other structure, however, needs to define a plane 1011 (the slant-lined area in the drawing) through which the toroidal magnetic field of the cable conductor perpendicularly passes so that the magnetic field and the resonator resonate together to generate a strong diamagnetism and thereby to suppress the common-mode radiation.

FFIG. 6A is a pictorial view of a resonator in accordance with another embodiment of the present invention, and FFIG. 6B is a front view of the resonator shown in FFIG. 6A. FFIG. 6 illustrates an alternative example of the structure of the SRR 101 shown in FFIG. 1. Compared with the SRR 101 of FFIG. 1, the resonator of FFIG. 6 comprises an extending member in the −Y direction at the lower side thereof. FFIG. 7A is a pictorial view of a resonator in accordance with another embodiment of the present invention, and FFIG. 7B is a front view of the resonator shown in FFIG. 7A. The resonator of FFIG. 7 has two loop-shaped structures. Each of the two loop-shaped structures has a split, and one of the two loop-shaped structures is arranged within the other. FFIG. 8A is a pictorial view of a resonator in accordance with another embodiment of the present invention, and FFIG. 8B is a front view of the resonator shown in FFIG. 8A. The resonator of FFIG. 8 has two parallel loop-shaped structures. Each of the two loop-shaped structures has a split, and the split of one loop-shaped structure is in the +Z direction and the split of the other loop-shaped structure is in the −Z direction. FFIG. 9A is a pictorial view of a resonator in accordance with another embodiment of the present invention, and FFIG. 9B is a front view of the resonator shown in FFIG. 9A. The resonator of FFIG. 9 has a spiral structure. When viewed in the +Y direction, the resonator of FFIG. 9 has a structure coiled inwardly in a clockwise direction. FFIG. 10A is a pictorial view of a resonator in accordance with another embodiment of the present invention, and FFIG. 10B is a front view of the resonator shown in FFIG. 10A. The resonator of FFIG. 10 has two parallel loop-shaped structures. Each of the two loop-shaped structures has a split, and an end of one loop-shaped structure is connected to an end of the other loop-shaped structure via a connecting member.

The spirit and scope of the present invention are not limited to the aforementioned embodiments. In addition, it will be understood that the drawings are merely schematic representations of the invention and not illustrated according to actual scale, and some of the components may have been magnified or simplified for purposes of pictorial clarity. The embodiments depicted above and the appended drawings are exemplary and are not intended to limit the scope of the present invention. The scope of the present invention is defined by the appended claims.

What is claimed is:

1. A device for suppressing common-mode radiation comprising:
    a plurality of resonators, each of which having at least one loop-shaped structure, embedded into a flexible plate, wherein each one of the resonators embedded in the flexible plate is independent of the other ones;
    wherein the at least one loop-shaped structure defines a plane having a normal direction parallel and perpendicular, respectively, to a longitudinal direction and a thickness direction of the plate; and
    wherein the at least one loop-shaped structure may include a split or no split.

2. The device for suppressing common-mode radiation according to claim 1, wherein the plurality of resonators are embedded into the plate and arranged into arrays.

3. The device for suppressing common-mode radiation according to claim 1, wherein each one of the plurality of the resonators is a split-ring resonator (SRR).

4. The device for suppressing common-mode radiation according to claim 3, wherein the SRR has a split in which a resistance is disposed.

5. The device for suppressing common-mode radiation according to claim 1, wherein each one of the plurality of the resonators is a spiral resonator.

6. The device for suppressing common-mode radiation according to claim 1, wherein each one of the plurality of the resonators comprises metal strips and via-posts.

7. The device for suppressing common-mode radiation according to claim 1, wherein the device for suppressing common-mode radiation is configured to wrap a cable conductor therein, and a magnetic field generated by the cable conductor passes through the plane when the device for suppressing common-mode radiation wraps the cable conductor therein.

8. The device for suppressing common-mode radiation according to claim 1, wherein the device for suppressing common-mode radiation is configured to wrap a cable conductor therein, and a magnetic field generated by the cable conductor perpendicularly passes through the plane when the device for suppressing common-mode radiation wraps the cable conductor therein.

9. The device for suppressing common-mode radiation according to claim 1, wherein the plate is a flexible circuit board.

10. The device for suppressing common-mode radiation according to claim 1, wherein the plate is made of a ferromagnetic material.

11. The device for suppressing common-mode radiation according to claim 1, wherein the plate is made of a lossy material.

12. A device for suppressing common-mode radiation comprising:
    at least one resonator embedded into a plate;
    wherein the at least one resonator defines a plane through which a magnetic field generated by a cable conductor passes when the device for suppressing common-mode radiation wraps the cable conductor therein.

13. The device for suppressing common-mode radiation according to claim 12, wherein the magnetic field generated by the cable conductor perpendicularly passes through the plane when the device for suppressing common-mode radiation wraps the cable conductor therein.

14. The device for suppressing common-mode radiation according to claim 12, wherein the plane of the at least one resonator has a normal direction parallel and perpendicular, respectively, to a longitudinal direction and a thickness direction of the plate.

15. The device for suppressing common-mode radiation according to claim 12, wherein the at least one resonator is a plurality of resonators embedded into the plate and arranged into arrays.

16. The device for suppressing common-mode radiation according to claim 12, wherein the at least one resonator is a split-ring resonator (SRR).

17. The device for suppressing common-mode radiation according to claim 16, wherein the SRR has a split in which a resistance is disposed.

18. The device for suppressing common-mode radiation according to claim 12, wherein the at least one resonator is a spiral resonator.

19. The device for suppressing common-mode radiation according to claim 12, wherein the at least one resonator comprises metal strips and via-posts.

20. The device for suppressing common-mode radiation according to claim 12, wherein the plate is a flexible circuit board.

21. The device for suppressing common-mode radiation according to claim 12, wherein the plate is made of a ferromagnetic material.

22. The device for suppressing common-mode radiation according to claim 12, wherein the plate is made of a lossy material.

* * * * *